US011881703B2

(12) United States Patent
Raisigel

(10) Patent No.: US 11,881,703 B2
(45) Date of Patent: Jan. 23, 2024

(54) DEVICES FOR DETECTING AN ARC FAULT AND ASSOCIATED ARC-FAULT-PROTECTION UNITS

(71) Applicant: Schneider Electric Industries SAS, Rueil Malmaison (FR)

(72) Inventor: Hynek Raisigel, Saint Egreve (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 466 days.

(21) Appl. No.: 17/121,832

(22) Filed: Dec. 15, 2020

(65) Prior Publication Data
US 2021/0184449 A1 Jun. 17, 2021

(30) Foreign Application Priority Data

Dec. 16, 2019 (FR) ..................................... 1914520

(51) Int. Cl.
*H02H 1/00* (2006.01)
*H02H 3/10* (2006.01)
*H02H 3/26* (2006.01)

(52) U.S. Cl.
CPC .......... *H02H 1/0015* (2013.01); *H02H 3/105* (2013.01); *H02H 3/26* (2013.01)

(58) Field of Classification Search
CPC ......... G01R 31/08–086; H02H 1/0015; H02H 3/105; H02H 3/26
See application file for complete search history.

(56) References Cited

U.S. PATENT DOCUMENTS

| 6,137,418 A * | 10/2000 | Zuercher ................ H02H 3/083 318/650 |
| 2002/0125892 A1* | 9/2002 | Parker .................. G01R 31/086 324/536 |
| 2004/0066593 A1* | 4/2004 | Kolker ................... G01R 31/52 361/42 |

(Continued)

FOREIGN PATENT DOCUMENTS

| CN | 107085158 A | 8/2017 |
| CN | 107370123 B | 2/2019 |

(Continued)

OTHER PUBLICATIONS

Republique Francaise Institut National De La Propriete Industrielle, French Search Report and Opinion for French Patent Application No. FR1914520 dated Aug. 20, 2020, 10 pages.

*Primary Examiner* — Patrick Assouad
*Assistant Examiner* — Demetrius R Pretlow
(74) *Attorney, Agent, or Firm* — Locke Lord LLP

(57) ABSTRACT

A device for detecting an arc fault in a polyphase electrical installation comprises:
- a high-frequency measuring system coupled to at least two electrical phase lines of the installation, said measuring system being configured to extract a first signal representative of high-frequency components of electrical currents flowing through said phase lines;
- a plurality of low-frequency measuring systems, each coupled to one electrical phase line of the installation, each being configured to acquire a second signal representative of the alternating line current flowing through the corresponding phase line; and
- a data-processing module programmed to detect an arc fault on the basis of the second signals and of the first signal.

16 Claims, 6 Drawing Sheets

(56) References Cited

U.S. PATENT DOCUMENTS

| | | | |
|---|---|---|---|
| 2008/0106832 A1* | 5/2008 | Restrepo | H02H 1/0015 |
| | | | 361/42 |
| 2008/0204949 A1* | 8/2008 | Zhou | H02H 1/0015 |
| | | | 361/42 |
| 2009/0161270 A1* | 6/2009 | Beatty, Jr. | H02H 1/0015 |
| | | | 361/42 |
| 2011/0141644 A1* | 6/2011 | Hastings | H01L 31/02021 |
| | | | 361/93.2 |
| 2012/0098672 A1 | 4/2012 | Restrepo et al. | |
| 2014/0095086 A1 | 4/2014 | Parker et al. | |
| 2014/0218044 A1* | 8/2014 | Ostrovsky | H02H 1/0015 |
| | | | 340/650 |
| 2016/0187407 A1* | 6/2016 | Kolker | G01R 31/52 |
| | | | 324/551 |
| 2016/0187408 A1* | 6/2016 | Kolker | G01R 19/16533 |
| | | | 324/551 |
| 2016/0187409 A1* | 6/2016 | Kolker | H02H 1/0015 |
| | | | 361/42 |
| 2016/0187410 A1* | 6/2016 | Kolker | H02H 1/0015 |
| | | | 361/42 |
| 2019/0199080 A1* | 6/2019 | Schmalz | H02H 3/26 |
| 2019/0339961 A1 | 11/2019 | Jakupi | |
| 2019/0363530 A1* | 11/2019 | Jakupi | H02H 1/0015 |
| 2022/0091172 A1* | 3/2022 | Varga | H02H 1/0015 |

FOREIGN PATENT DOCUMENTS

| | | |
|---|---|---|
| DE | 19940343 A1 | 3/2001 |
| GB | 2536989 A | 10/2016 |
| IN | 108535589 A | 9/2018 |

* cited by examiner

DEVICES FOR DETECTING AN ARC FAULT AND ASSOCIATED ARC-FAULT-PROTECTION UNITS

TECHNICAL FIELD

Aspects of the invention relate to devices for detecting an arc fault, particularly in an electrical installation. The invention also concerns arc-fault-protection units comprising such a detection device.

Generally, the invention applies to the field of arc protection, and aims particularly to allow detection of arc faults in a polyphase AC electrical installation.

BACKGROUND

Arc-fault-protection units, such as circuit breakers, are sometimes configured to detect arc faults capable of occurring in a polyphase electrical installation. This detection is based on a measuring device comprising low-frequency current sensors and high-frequency current sensors, which are associated with the various phase conductors of the electrical installation. An arc fault on a phase line generates specific variations in the LF and HF current that are detectable most highly on the faulted phase line.

However, existing detection devices are not always satisfactory, particularly in terms of the number of sensors and the complexity of the associated processing circuits.

SUMMARY

There is therefore a need for a device for detecting arc faults in an AC system that exhibits satisfactory performance levels while being simple to manufacture.

To this end, one aspect of the invention concerns a device for detecting an arc fault in a polyphase electrical installation, said device comprising:
  a high-frequency measuring system coupled to at least two of the electrical phase lines of the installation, said measuring system being configured to extract a first signal representative of high-frequency components of electrical currents flowing through said phase lines, particularly when an arc fault is present;
  a plurality of low-frequency measuring systems, each coupled to one electrical phase line of the installation, each being configured to acquire a second signal representative of the alternating line current flowing through the corresponding phase line;
  a data-processing module programmed to detect an arc fault on the basis of the second signals and of the first signal.

Thus, a single high-frequency measuring system is used for all of the electrical phase lines. It is therefore not necessary to use one high-frequency measuring system per phase line, as this would multiply the number of current sensors and signal processing systems, which would increase the complexity and the cost of manufacturing the detection device. The solution nevertheless allows arc faults to be detected sufficiently reliably and effectively.

According to advantageous but non-obligatory aspects, such a detection device can incorporate one or more of the following features, taken in isolation or according to any technically admissible combination:
  The measuring device comprises a plurality of single-phase current sensors, each configured to be associated with one electrical phase line of the electrical installation, and in which the high-frequency measuring system is configured to combine the high-frequency measurement signals deriving from the current sensors to form a composite signal from which said first signal is extracted.
  The outputs of the current sensors are connected to an input of the high-frequency measuring system by capacitors.
  The outputs of the current sensors are connected to an input of the high-frequency measuring system by resistors.
  The outputs of the current sensors are connected to the high-frequency measuring system by means of a magnetic coupling device, each of said outputs being connected to a primary winding, said primary windings being magnetically coupled to a secondary winding connected to an input of the high-frequency measuring system.
  The high-frequency measuring system comprises a dedicated current sensor, such as a measurement toroid, configured to be coupled to at least two of the electrical phase lines and configured to generate a composite signal from which said first signal is extracted, and in which the detection device comprises a plurality of single-phase current sensors, each configured to be associated with one electrical phase line of the circuit, each single-phase current sensor being associated with one of the low-frequency measuring systems.
  The single-phase current sensors are current transformers.
  Each current sensor comprises a magnetic toroid and a measurement coil wound around the magnetic toroid and configured to provide a wideband measurement signal at its terminals, the measurement coil comprising fewer than forty turns or, preferably, fewer than twenty turns.
  The high-frequency measuring system comprises a pass-band filter configured to remove from the acquired signal the components having a frequency lower than a predefined threshold.
  The high-frequency measuring system comprises a demodulator, such as a logarithmic amplifier or a heterodyne mixer, configured to demodulate said first representative signal before transmitting it to the processing module.
  The high frequencies are frequencies higher than or equal to 1 MHz, or higher than or equal to 5 MHz, preferably frequencies between 5 MHz and 40 MHz.

According to another aspect, an arc-fault-protection unit comprises an electrical switching device capable of interrupting the flow of current through a polyphase electrical installation on receiving a trip signal, and a detection device as described above and coupled to the switching device.

BRIEF DESCRIPTION OF THE DRAWINGS

The invention will be better understood and other advantages thereof will become more clearly apparent in the light of the following description of one embodiment of a detection device provided solely by way of example and with reference to the appended drawings, in which.

DETAILED DESCRIPTION

Figure 1:
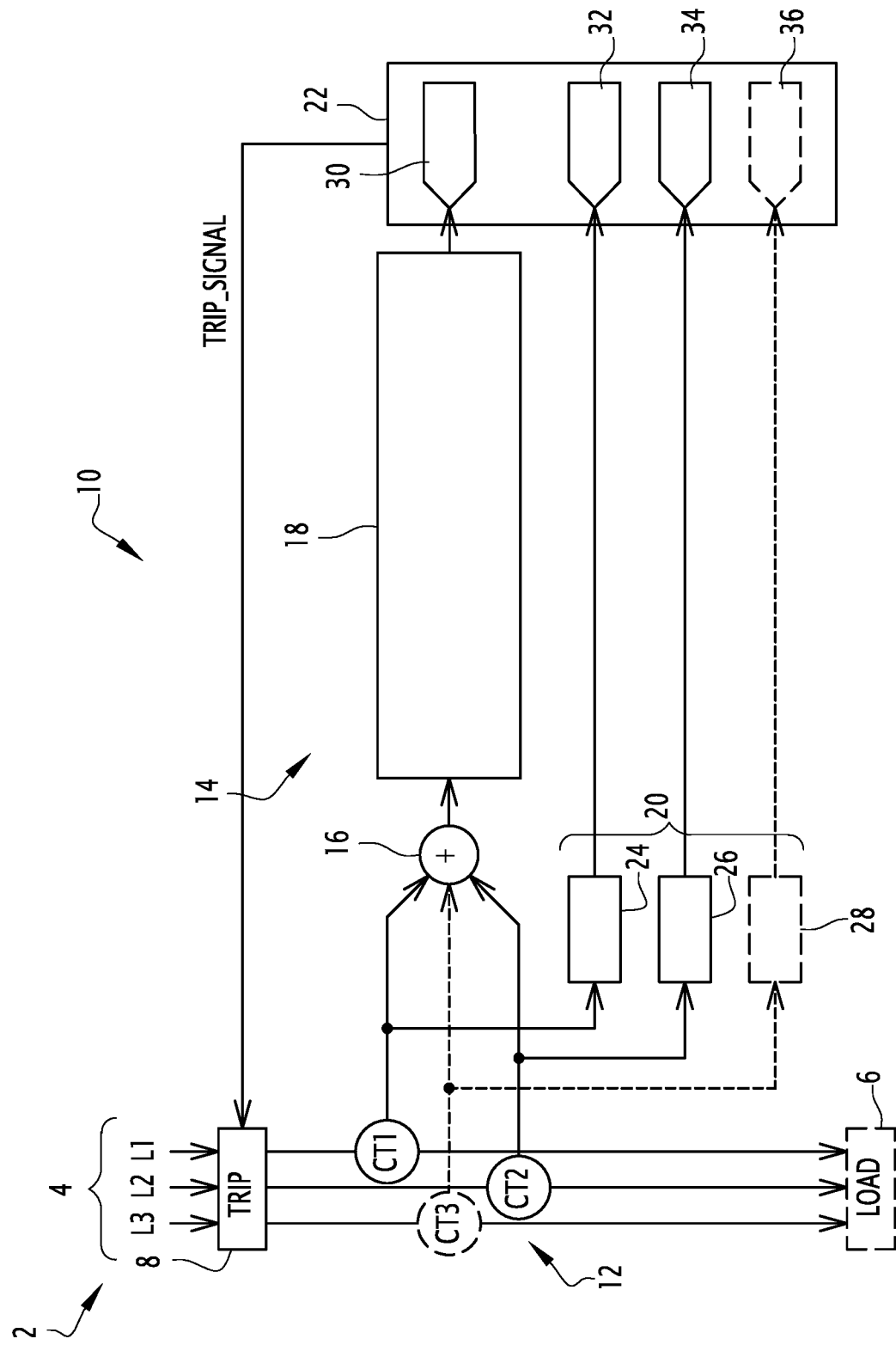
FIG. 1 is a schematic representation of a device for detecting an arc fault for an electrical installation according to one embodiment.

FIG. 1 shows a polyphase electrical installation 2, such as an electricity distribution installation 2 or, more generally, an AC electrical system.

The installation 2 comprises multiple electrical conductors 4, each associated with one electrical phase line, or pole, in order to allow the flow of a polyphase current, particularly the flow of a three-phase current.

Figure 3:
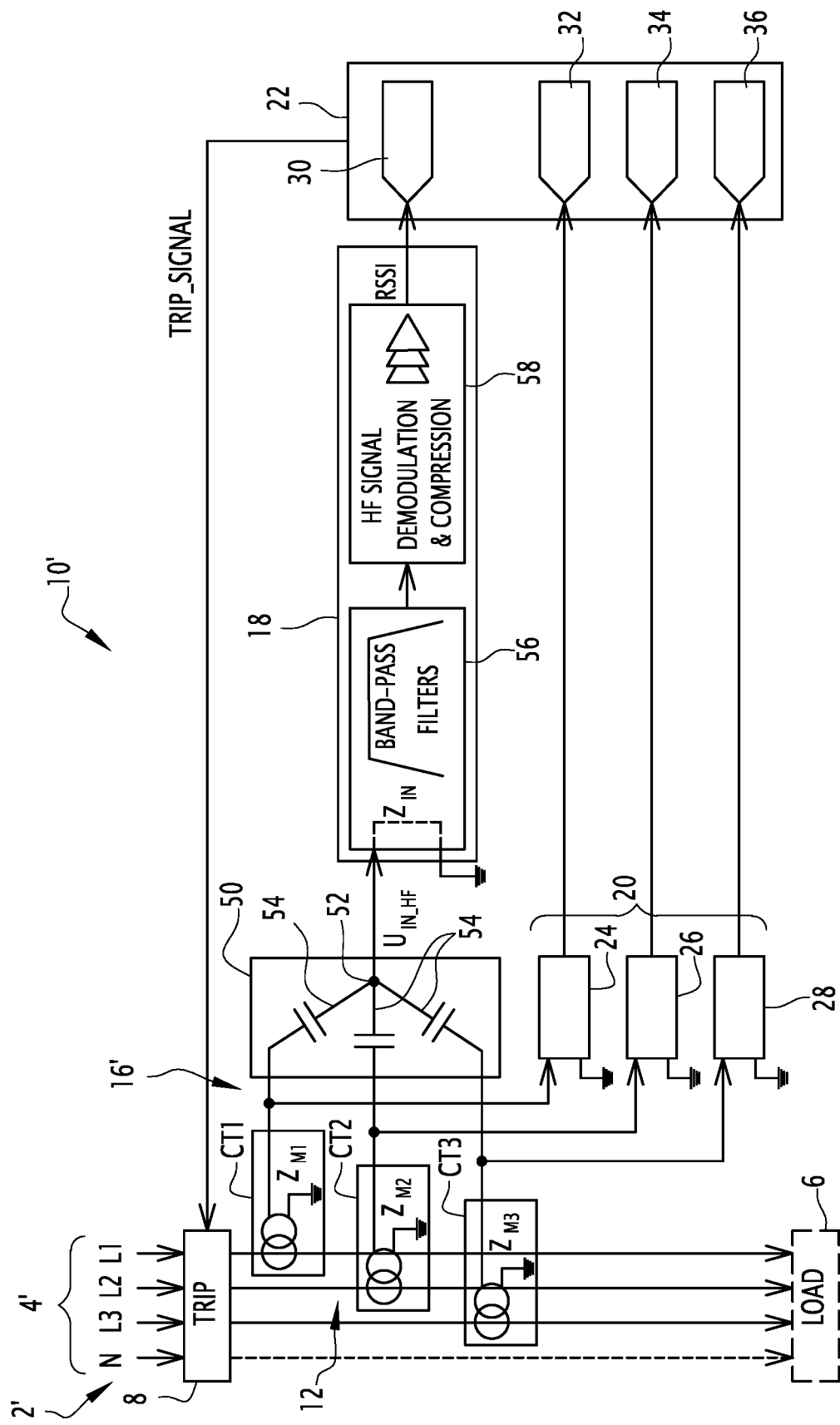
FIG. 3 is a schematic representation of another embodiment of the device for detecting an arc fault from FIG. 1.

In the examples described below, the installation 2 comprises three phase lines, denoted L1, L2 and L3, with optionally a "neutral" conductor (FIG. 3).

This example is non-limiting and, as a variant, a different number of phase lines may be envisaged. The embodiments described below can be transposed for a polyphase system other than a three-phase system, for example a two-phase system, or a quadripolar system comprising three phase lines and a neutral line.

For example, the conductors 4 are connected to an electrical load 6, denoted "LOAD", intended to be supplied with the polyphase electrical current.

In numerous embodiments, an arc-fault-protection unit is associated with the installation 2 in order to protect it against arc faults. For example, such arc faults can occur between two phase lines, or between one phase line and the protected electrical load or between one phase line and earth.

For example, the protection unit can comprise an electrical switching device 8 and a detection device 10 coupled to the switching device 8. The switching device 8, denoted "TRIP", is configured to interrupt the flow of current through the installation 2, and more especially through the conductors 4, on receiving a trip signal, denoted "TRIP_SIGNAL" here.

For example, the switching device 8 comprises separable electrical contacts coupled to a mechanical or electromechanical trip mechanism.

The detection device 10 is particularly configured to detect an arc fault in the installation 2.

In accordance with numerous embodiments, the detection device 10 comprises:
  current sensors 12;
  a so-called high-frequency (HF) measuring and/or processing system 14, this system 14 being coupled to at least two of the electrical phase lines L1, L2, L3 of the installation, or even to all of said phase lines, said measuring system 14 being configured to extract, particularly by demodulation, a first signal representative of high-frequency components of electrical currents flowing through said phase lines, this measuring system 14 here comprising a device 16 for combining the high-frequency measurement signals deriving from the various sensors to form a high-frequency composite signal from which said representative signal will subsequently be extracted, and a preprocessing stage 18;
  a plurality of low-frequency measuring systems 20, each coupled to an electrical phase line of the installation, each being configured to acquire a second signal representative of the alternating line current flowing through the corresponding phase line;
  a data-processing module 22, configured to detect an arc fault on the basis of the second signals and of the first high-frequency signal.

In practice, when an arc fault occurs in the installation 2, high-frequency current components, and more particularly high-frequency noise, are superimposed on the line current flowing through the phase lines L1, L2 and L3 of the installation 2.

In numerous examples, as illustrated in FIG. 1, the current sensors, referred to collectively here by the reference 12 and individually denoted CT1, CT2 and CT3, are single-phase current sensors. For example, each of these sensors is associated with one electrical phase line L1, L2, L3, for example by each being connected around a corresponding conductor 4.

For example, the system 10 comprises one current sensor 12 for each of the phase lines L1, L2 and L3. In other words, the system 10 comprises three sensors 12.

Preferably, each of the sensors 12 is configured to measure an alternating current flowing through the phase line with which it is associated, with a wide frequency measurement band, particularly for measuring high-frequency components of the alternating current, such as high-frequency noise generated when an arc fault is present on the phase line.

For example, within the meaning of the present description, "high frequencies" are frequencies higher than or equal to 1 MHz, or higher than or equal to 5 MHz, preferably frequencies between 5 MHz and 40 MHz, or even frequencies between 10 MHz and 20 MHz.

Low frequencies are, for example, frequencies lower than or equal to 50 kHz, or lower than or equal to 10 kHz, or even lower than or equal to 1 kHz. For example, the sensors 12 have a wide frequency measurement band and can thus measure both high-frequency components and other components, particularly the low-frequency components of the line currents flowing through the conductors 4.

Preferably, the measurement frequency band of the sensors 12 is between 50 Hz and 50 MHz.

In this example, the device 10 comprises three low-frequency measuring systems, individually denoted 24, 26 and 28, each of them being associated with one electrical phase line L1, L2, L3, the current sensors CT1, CT2 and CT3 being connected to the systems 24, 26 and 28, respectively.

This example is non-limiting and, as a variant, the number of current sensors 12 could be chosen differently; for example, just two current sensors 12 can be used. The same goes for the number of low-frequency measuring systems 20.

In practice, the device 10 can comprise as many low-frequency measuring systems 20 as current sensors 12. It is particularly understood that each low-frequency measuring system 20 is associated with a single phase line L1, L2 or L3 of the installation.

It is also understood that the system 10 here comprises a single high-frequency measuring system 14, which is common to all of the phase lines L1, L2 and L3 of the installation, or at least to all of the phase lines for which the high-frequency component of the current is measured.

In numerous embodiments, the current sensors 12 are current transformers, or Rogowski coils. For example, the output of each current sensor 12 provides a wideband measurement signal, such as a voltage, representing the low-frequency electrical current flowing through the conductor 4 to which the current sensor 12 is coupled, on which voltage the high-frequency signal that is also present in the same conductor is superimposed.

For example, each current sensor 12 comprises a magnetic toroid and a measurement coil wound around the magnetic toroid, preferably made from ferrite material, and configured to provide a measurement signal at its terminals.

Preferably, the measurement coil of each current sensor 12 comprises fewer than forty turns or, preferably, fewer than twenty turns, which allows parasitic capacitances to be limited and allows the high-frequency components of the measured signal to be prevented from being inadvertently removed, which thus allows the quality of the measured signal to be improved.

In embodiments, as illustrated in FIG. 1, the sensors 12 are common to the high-frequency measuring system 14 and to the low-frequency measuring systems 20. In other words, the outputs of the sensors 12 are connected both to the input of the high-frequency system 14 and to the respective inputs of the low-frequency systems 24, 26 and 28.

It is therefore understood that the system 14 is configured to extract the high-frequency component of the signals measured by the sensors 12 and, more specifically, to perform this extraction on the composite signal output by the device 16.

In practice, each low-frequency measuring system 24, 26, 28 here is configured to collect the signal measured by one of the current sensors 12 and to formate this signal before providing it to the processing module 22.

In other words, in this example, the current measurements are taken by the current sensors 12 and each of the systems 24, 26 and 28 processes the signals measured by the current sensor 12 specific to a phase line L1, L2 or L3 with which it is associated.

For example, each low-frequency measuring system 24, 26, 28 can comprise active integrators which are capable of amplifying and/or filtering and/or recreating the trend in the line currents flowing through the corresponding conductors 4, on the basis of the low-frequency measurement signals output at the output of the current sensors 12, or at the very least of recreating the trend in the low-frequency components of these line currents.

In numerous embodiments, the data-processing module 22 is implemented by one or more electronic circuits.

For example, the module 22 comprises a processor, such as a programmable microcontroller or a microprocessor.

The processor is coupled to a computer memory, or to any computer-readable data storage medium, which comprises executable instructions and/or software code intended to implement a method for detecting an arc fault when these instructions are executed by the processor.

As a variant, the module 22 can comprise a signal processing processor (DSP), or a reprogrammable logic component (FPGA), or an application-specific integrated circuit (ASIC), or any equivalent element configured and/or programmed to implement said detection method.

The module 22 comprises a first interface 30 for acquiring the first representative signal at the output of the high-frequency measuring system 14. The module 22 also comprises one or more second interfaces 32, 34 and 36 respectively configured to receive the second signals at the output of the low-frequency measuring systems 20.

For example, the interfaces 30, 32, 34 and 36 each comprise an analogue-to-digital converter configured to acquire and sample a corresponding signal.

Embodiments of the device 16 are now described with reference to FIGS. 1, 2 and 3.

The device 16 allows the high-frequency measuring system 14 to combine the high-frequency measurement signals deriving from the various sensors 12, in order to form said composite signal that is common to the various phase lines, on the basis of the electrical currents measured for each of the phase lines with which sensors 12 are associated.

More particularly, the device 16 allows the high-frequency measurement signals deriving from the various sensors 12 to be added to form said composite signal.

Preferably, this summing is carried out in analogue fashion, that is to say using discrete electrical or electronic components, such as impedance dipoles, without resorting to an electronic digital processing circuit, which allows an implementation that is less expensive and does not consume computation resources of the module 22.

It is understood that in general the device 16 is connected downstream of the sensors 12 and upstream of the preprocessing stage 18. For example, the sensors 12, and the device 16, form a measurement stage for the measuring system 14, this measurement stage being coupled to said phase lines L1, L2, L3.

Figure 2:
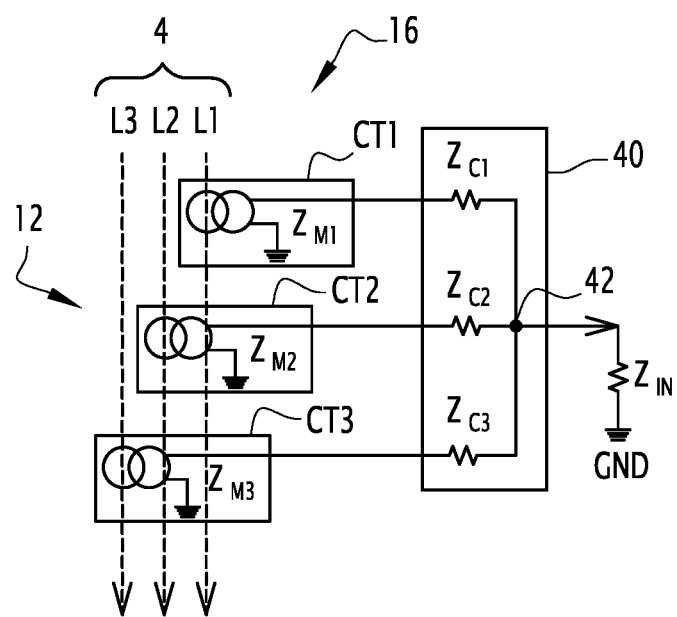
FIG. 2 is an electrical diagram of one embodiment of a high-frequency measurement stage of the detection device from FIG. 1.

According to a first example, which is illustrated in FIG. 2, the outputs of the current sensors 12 are connected to a common point 42 by resistors arranged in a star, the common point 42 being connected to the input of the measuring system 14.

Thus, the device 16, bearing the reference 40 in this particular embodiment, comprises resistors $Z_{C1}$, $Z_{C2}$ and $Z_{C3}$, each one connected between the common point 42 and the sensor CT1, CT2 and CT3, respectively.

In this example, the impedance $Z_{IN}$ refers to the input impedance of the preprocessing stage 18, measured between the common point 42 and the electrical earth GND of the system. The impedances $Z_{M1}$, $Z_{M2}$ and $Z_{M3}$ refer to the output impedances of the sensors CT1, CT2 and CT3, respectively.

According to a second example, not illustrated, the device 16 is a magnetic coupling device.

For example, the outputs of the current sensors 12 are connected to the high-frequency measuring system 14 by means of the magnetic coupling device comprising primary windings and a secondary winding. Each of the sensor 12 outputs is connected to a primary winding. The primary windings are magnetically coupled to the secondary winding, which is itself connected to an input of the measuring system 14.

To improve the coupling, the device 16 can comprise a magnetic core around which the respective primary windings of the current sensors 12 and the secondary winding are wound.

According to a third example, illustrated in FIG. 3, the outputs of the current sensors 12 are connected to a common point 52 by capacitors 54 arranged in a star, the common point 52 being connected to the input of the measuring system 14. Thus, the device 16, bearing the reference 50 in this particular embodiment, comprises, preferably identical, capacitors 54, each capacitor 54 being connected between the common point 52 and a sensor CT1, CT2 and CT3, respectively.

It is advantageous to use capacitors 54 to combine the signals measured by the current sensors 12, because the impedance of the capacitors is inversely proportional to the frequency, such that the impedance at high frequency is relatively low, which favours coupling at high frequency while ensuring good isolation between the various line current signals for low frequencies.

The reference $U_{IN\_HF}$ refers to the composite signal obtained at the output of the device 16 on the basis of the electrical currents measured by the current sensors 12.

In embodiments, the composite signal $U_{IN\_HF}$ corresponds to the combination of the high-frequency contributions for the various phase lines L1, L2 and L3 of the installation. In other embodiments, the composite signal $U_{IN\_HF}$ corresponds to the combination of the single currents measured for the various phase lines L1, L2 and L3 of the installation, without a frequency distinction, the extraction of the high-frequency contributions being obtained only by means of subsequent processing (such as filtering) in the preprocessing stage 18.

For example, the composite signal $U_{IN\_HF}$ is a voltage.

It is noted that, in the example of FIG. 3, the electrical installation 2' differs from the installation 2 in that the electrical conductors 4' moreover comprise, in addition to the three phase lines L1, L2 and L3, a neutral line, denoted N here. This neutral line N can be omitted without changing the operation of the detection system 10' or changing the operation of the device 16, however.

According to variants that are neither illustrated nor described in detail, the device 16 could also be realized differently, for example by using more complex circuits, such as one or more passband filters in the frequency domain used for detecting arc faults.

Embodiments of the preprocessing stage 18 are now described with reference to FIG. 3.

In numerous embodiments, and not just that of FIG. 3, the preprocessing stage 18 is configured to extract, particularly by demodulation, the first signal representative of high-frequency components of electrical currents flowing through said phase lines from the composite signal $U_{IN\_HF}$ prior to acquisition by the processing module 22.

For example, the preprocessing stage 18 comprises at least one filter 56 configured to remove from the acquired composite signal $U_{IN\_HF}$ the components having a frequency lower than a predefined threshold, such as a predefined threshold equal to 5 MHz or to 1 MHz.

In the examples illustrated, the filter 56 is a passband filter. This passband filter can be configured so as to let past only frequencies of the composite signal $U_{IN\_HF}$ between 1 MHz and 50 MHz, or preferably between 5 MHz and 40 MHz, or even frequencies between 10 MHz and 20 MHz.

Thus, the filter 56 allows the extraction of the high-frequency components from the composite signal originating from the measurements taken by the current sensors 12.

The preprocessing stage 18 also comprises a demodulator 58, such as a logarithmic amplifier or a heterodyne mixer, configured to demodulate said first signal before transmitting it to the processing module 22. For example, the preprocessing stage 18 is connected downstream of the filter 56.

In particular, the demodulator 58 allows the envelope of the first signal $U_{IN\_HF}$ to be extracted. A corresponding envelope signal, denoted RSSI here in FIG. 3, is then sent to the input 30 of the processing module 22.

The preprocessing stage 18 therefore allows the extraction, particularly by demodulation, from the first signal, originating from the combination of the signals measured individually by the current sensors 12, of information about the power value or about the RMS value of the amplitude (the envelope) of said first signal.

In relation to the composite signal $U_{IN\_HF}$, the waveform of the demodulated signal (RSSI) develops more slowly, that is to say at frequencies significantly lower than 1 MHz, for example at least 100 times lower than 1 MHz. The waveform of the demodulated signal is simpler to sample and requires fewer computation resources than sampling the composite signal $U_{IN\_HF}$. Nevertheless, the waveform itself contains sufficient useful information to allow detection of the arc fault with sufficient reliability. The processing module 22 therefore does not need to acquire the whole of the first signal.

Owing to the invention, a single high-frequency measuring system 14 is used for all of the electrical phase lines L1, L2 and L3. It is therefore not necessary to use one high-frequency measuring system per phase line, as this would accordingly multiply the number of signal processing and preprocessing components in the detection device. Now, the components required for processing high-frequency signals are generally expensive. Such a multiplication would therefore increase the complexity and the cost of manufacturing the detection device.

The various embodiments of the detection device 10 or 10' nevertheless allow arc faults to be detected sufficiently reliably and effectively, even using just a single high-frequency signal processing chain common to multiple phase lines and on the basis of the first signal $U_{IN\_HF}$ without directly using the signals measured individually for each phase line.

Indeed, the occurrence of an arc fault in one of the phase lines L1, L2 or L3 generates noise on the currents flowing through the various phase lines. This noise is randomly phase-shifted between the various phase lines at high frequencies and can also be amplified or attenuated at random from one phase line to the other, so that the sum of the high-frequency components of these currents is not zero. On the contrary, no such phase shift is present on the low-frequency components of these same currents, the latter remaining correlated among one another from one phase line to the other. The sum of the low-frequency components of these same currents is thus zero.

Measurement of the high-frequency noise on the electrical currents flowing through the phase lines L1, L2, L3 thus allows easy identification of an arc fault without needing to use, for high frequencies, measuring and signal processing means that are excessively complex and dedicated to each of the phase lines.

According to embodiments provided by way of example, an arc fault can be detected by a detection algorithm implemented in the processing module 22 by comparing the measured signals output by the low-frequency measuring chain with the first signal associated with the high-frequency components.

In particular, the module 22 can be configured to detect whether the sum of the low-frequency currents is zero while, at the same time, the sum of the high-frequency components of these same currents (which is provided by the first signal, or by its envelope, or by any appropriate representative quantity constructed by the preprocessing stage 18) is not zero.

The waveform of the high-frequency composite signal can advantageously be used as an arc-fault indicator. The presence of an arc fault is detected by a processing algorithm implemented in the module 22. As a detection algorithm response, the module 22 can be configured to send a trip signal TRIP_SIGNAL to the switching device 8 in order to interrupt the flow of current through the conductors 4.

Otherwise, no such signal is transmitted and the system continues its operation.

Other detection methods can be used, however.

Figure 4:
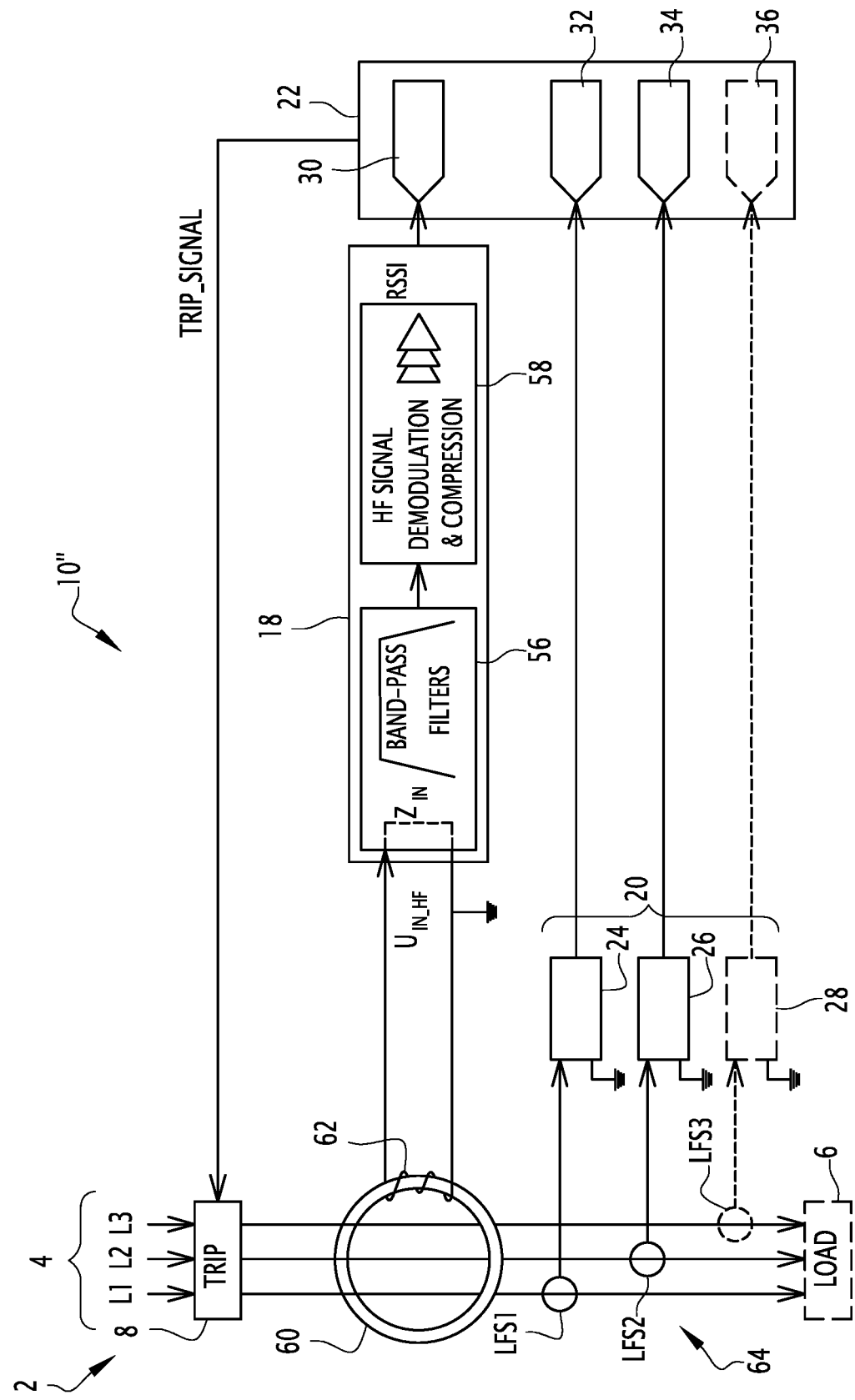
FIG. 4 is a schematic representation of another embodiment of the device for detecting an arc fault from FIG. 1.

FIG. 4 shows a detection device 10" according to another embodiment, which differs from the embodiments described previously in that the high-frequency measuring system 14 comprises a dedicated current sensor 60, such as a measurement toroid.

The current sensor 60 is configured to be coupled to at least two of the electrical phase lines L1, L2, L3, or even to all of the electrical phase lines, and replaces the sensors 12 and the device 16. In other words, in this embodiment, the device 16 is omitted, as are the current sensors 12.

In other words, the sensor 60 is used both to measure the electrical currents flowing through said phase lines and to combine the components specific to each phase line to form the composite signal $U_{IN\_HF}$.

It is therefore understood that, in this embodiment, the single current sensor 60 forms a measurement stage for the high-frequency measuring system 14. The preprocessing stage 18 is connected at the output of the current sensor 60.

For example, the sensor 60 is a differential measurement toroid, such as those used in differential circuit breakers. In the example illustrated, the sensor 60 comprises a magnetic toroid surrounding said phase lines and a measurement coil 62, connected to the input of the preprocessing device.

In the example illustrated, the detection device 10" also comprises a plurality of single-phase current sensors LFS1, LFS2, LFS3, collectively denoted 64, which are analogous to the sensors 12 described previously.

However, in this embodiment, the current sensors 64 are not connected to the high-frequency measuring system 14, since the latter has its own current sensor 60.

In practice, each of the current sensors 64 is configured to be associated with one electrical phase line of the circuit while being connected to one of the low-frequency measuring systems 20.

In this example, the device 10" comprises three low-frequency measuring systems 24, 26 and 28 as described previously, each of them being associated with one electrical phase line L1, L2, L3, the current sensors LFS1, LFS2 and LFS3 being connected to the measuring systems 24, 26 and 28, respectively. On the other hand, the current sensors LFS1, LFS2 and LFS3 are not connected to the high-frequency measuring system 14.

Apart from these differences, the operation of the detection device 10" is analogous, or even identical, to the operation of the detection devices 10 and 10' described previously, particularly as far as the role and operation of the processing module 22 and the preprocessing device 18 are concerned.

It is particularly understood that, in this embodiment, the detection device 10" in this case too comprises a single measuring system 14, common to all of the phase lines L1, L2 and L3 of the installation, or at least to all of the phase lines for which the high-frequency component of the current is measured.

Figure 5:
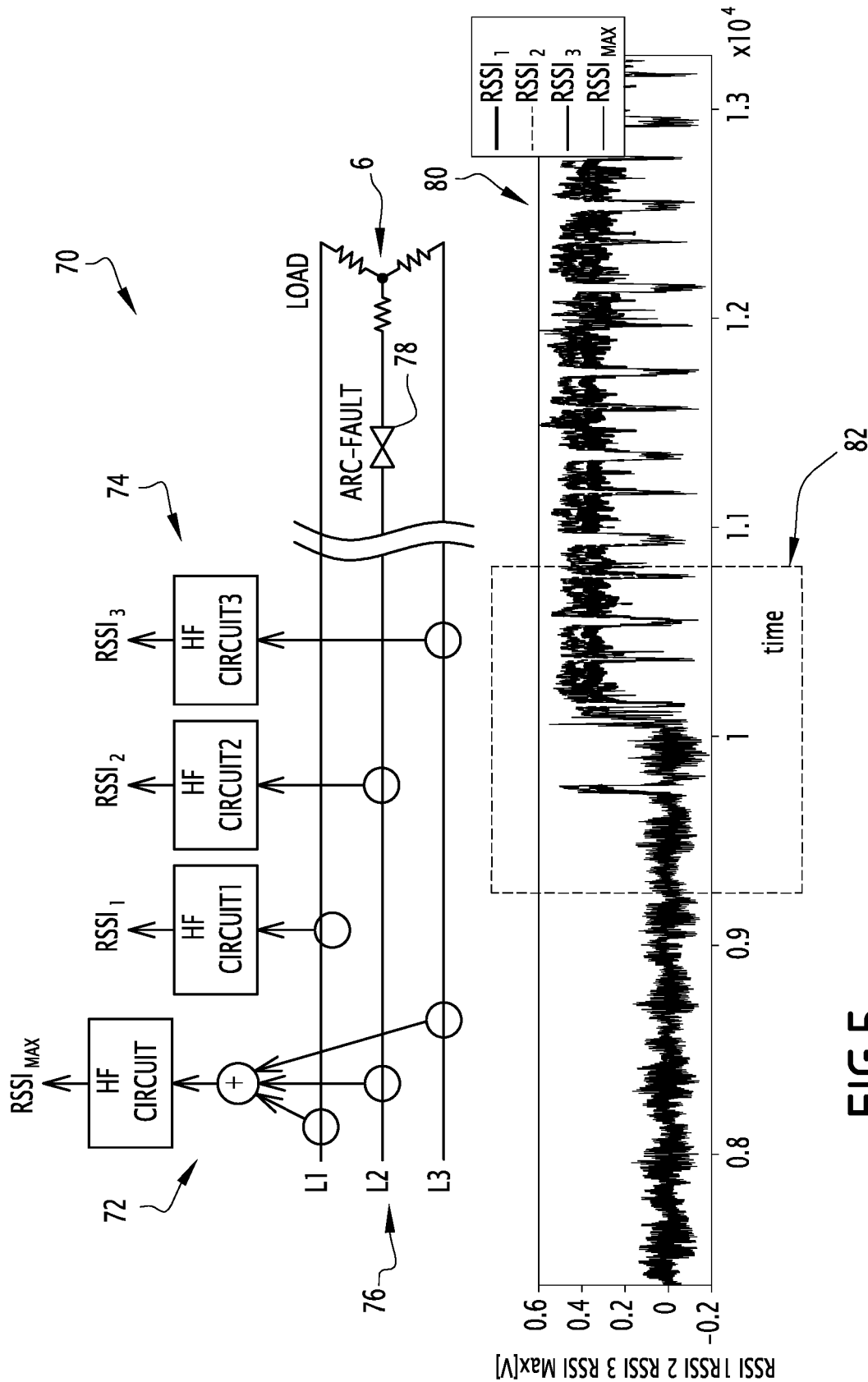
FIG. 5 schematically illustrates a comparison between a device for detecting an arc fault in accordance with embodiments and another detection device.

FIG. 5 illustrates an example of a comparison of the results obtained in order to detect an arc fault between, on the one hand, a detection device 72 in accordance with embodiments as described previously and, on the other hand, another detection device 74, in which each of the phase lines 76 of the installation 70 is associated with a sensor and a dedicated high-frequency measuring system, which are respectively denoted "HF Circuit1", "HF Circuit 2" and "HF Circuit 3". By contrast, the detection device 72 comprises a single high-frequency measuring system, denoted "HF Circuit", for all of the phase lines of the installation.

In the example illustrated, the consideration, for illustrative purposes, is that the arc fault 78, denoted "Arc-Fault", has occurred on the second phase line L2 between said phase line and earth. This example is non-limiting and, in practice, an arc fault can be detected on any phase line.

Figure 6:
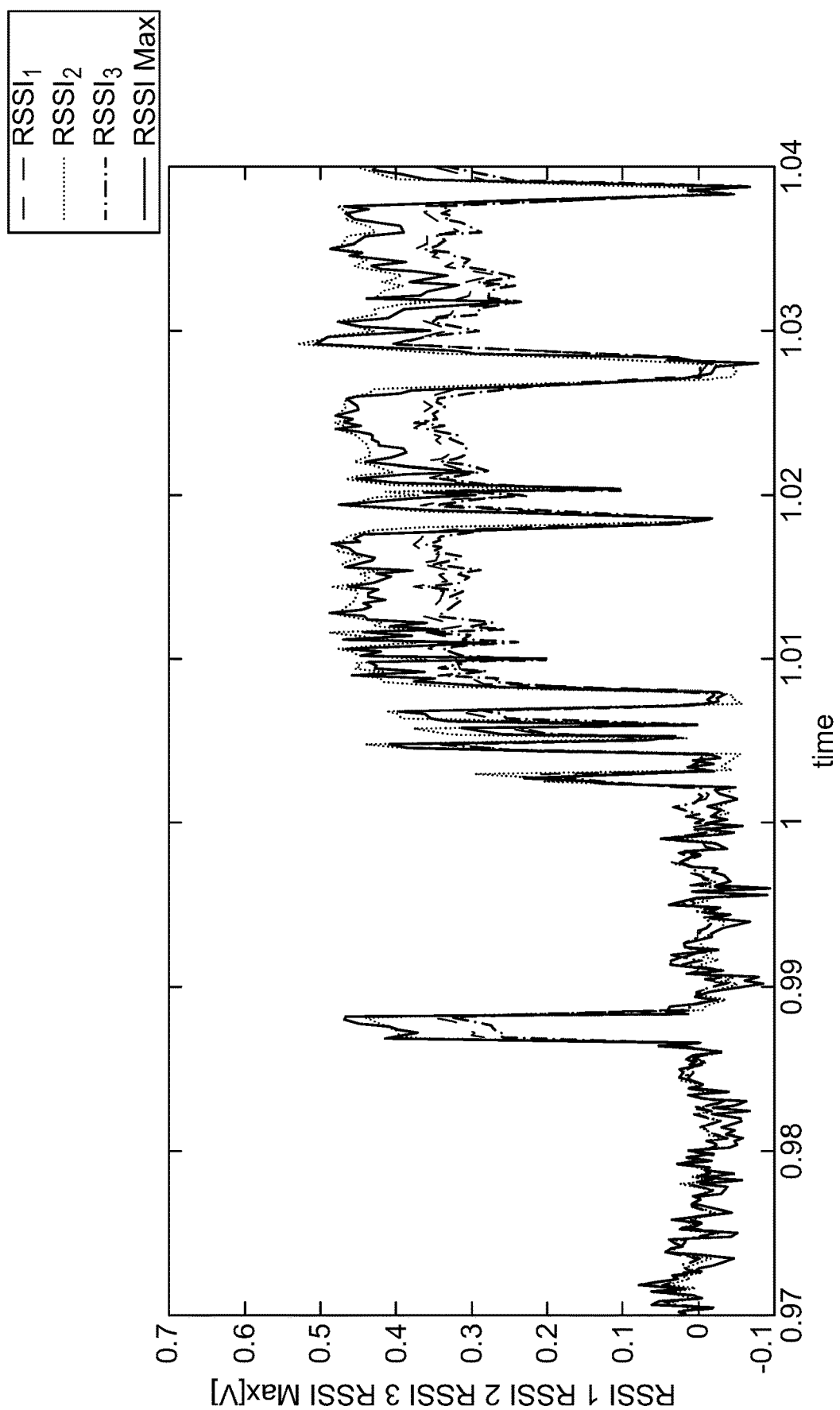
FIG. 6 is an enlarged view of the graph of FIG. 5.

The graph 80 illustrates the trend, as a function of time (x-axis, in milliseconds, denoted "time"), in the amplitude of the signals output by the two devices 72 and 74. FIG. 6 shows an enlarged view of the zone 82 of the graph 80.

In the example illustrated, the signal denoted "$RSSI_{MAX}$" corresponds to the signal delivered by the device 72, and corresponds here to the first signal RSSI representative of high-frequency components of electrical currents flowing through said phase lines, as defined in the previous embodiments.

The other signals "$RSSI_1$", "$RSSI_2$" and "$RSSI_3$" correspond, respectively, to the signals delivered by each of the high-frequency measuring systems of the other device 74.

In the graph, the signal $RSSI_2$ associated with the second phase line L2 has a maximum amplitude after the occurrence of the fault (a little after the time equal to 1 second), whereas the amplitude of the signals $RSSI_1$ and $RSSI_3$, which are associated with the neighbouring phase lines L1 and L3, is lower.

The amplitude of the first signal $RSSI_{MAX}$ output by the single measuring system 14 of the device 72 is for its part close to that of the signal $RSSI_2$.

Thus, the first signal output by the measuring system 14 can be substituted for the signals $RSSI_1$, $RSSI_2$ and $RSSI_3$ demodulated for each phase line, without, however, compromising the detection of an arc fault.

Any feature of one of the embodiments or variants described above can be implemented in the other embodiments and variants described.

The invention claimed is:

1. A device for detecting an arc fault in a polyphase electrical installation, the device comprising:
   a high-frequency measuring system coupled to at least two electrical phase lines of the installation, said measuring system being configured to extract a first signal representative of high-frequency components of electrical currents flowing through said phase lines;
   a plurality of low-frequency measuring systems, each coupled to one electrical phase line of the installation, each being configured to acquire a second signal representative of the alternating line current flowing through the corresponding phase line; and
   a data-processing module programmed to detect an arc fault on the basis of the second signals and of the first signal.

2. The device according to claim 1, in which the device comprises a plurality of single-phase current sensors, each configured to be associated with one electrical phase line of the electrical installation, and in which the high-frequency measuring system is configured to combine the high-frequency measurement signals deriving from the current sensors to form a composite signal from which said first signal is extracted.

3. The device according to claim 2, in which the outputs of the current sensors are connected to an input of the high-frequency measuring system by capacitors.

4. The device according to claim 2, in which the outputs of the current sensors are connected to an input of the high-frequency measuring system by resistors.

5. The device according to claim 2, in which the outputs of the current sensors are connected to the high-frequency measuring system by means of a magnetic coupling device, each of said outputs being connected to a primary winding, said primary windings being magnetically coupled to a secondary winding connected to an input of the high-frequency measuring system.

6. The device according to claim 1, in which the high-frequency measuring system comprises a dedicated current sensor, configured to be coupled to at least two of the electrical phase lines and configured to generate a composite signal from which said first signal is extracted, and in which the detection device comprises a plurality of single-phase current sensors, each configured to be associated with one electrical phase line of the circuit, each single-phase current sensor being associated with one of the low-frequency measuring systems.

7. The device according to claim 2, in which the single-phase current sensors are current transformers.

8. The device according to claim 7, in which each current sensor comprises a magnetic toroid and a measurement coil wound around the magnetic toroid and configured to provide a wideband measurement signal at its terminals, the measurement coil comprising fewer than forty turns.

9. The device according to claim 1, in which the high-frequency measuring system comprises a passband filter configured to remove from the acquired signal the components having a frequency lower than a predefined threshold.

10. The device according to claim 1, in which the high-frequency measuring system comprises a demodulator, configured to demodulate said first representative signal before transmitting it to the processing module.

11. The device according to claim 1, in which the high frequencies are frequencies higher than or equal to 1 MHz, or higher than or equal to 5 MHz.

12. An arc-fault-protection unit, comprising an electrical switching device capable of interrupting the flow of current through a polyphase electrical installation on receiving a trip signal, and a detection device in accordance with claim 1 and coupled to the switching device.

13. The device according to claim 6, wherein the dedicated current sensor is a measurement toroid.

14. The device according to claim 8, wherein the measurement coil comprises fewer than twenty turns.

15. The device according to claim 10, wherein the demodulator comprises one of a logarithmic amplifier or a heterodyne mixer.

16. The device according to claim 1, in which the high frequencies are frequencies between 5 MHz and 40 MHz.

\* \* \* \* \*